US006559728B1

(12) United States Patent
Fry

(10) Patent No.: US 6,559,728 B1
(45) Date of Patent: May 6, 2003

(54) MINIATURE OVENIZED CRYSTAL OSCILLATOR

(75) Inventor: Steven J. Fry, Carlisle, PA (US)

(73) Assignee: CTS Corporation, Elkhart, IN (US)

( * ) Notice: Subject to any disclaimer, the term of this patent is extended or adjusted under 35 U.S.C. 154(b) by 1 day.

(21) Appl. No.: 10/025,726

(22) Filed: Dec. 19, 2001

(51) Int. Cl.[7] .............................. H03B 5/32; H03B 5/36; H03B 5/04; H03L 1/02; H03L 1/04
(52) U.S. Cl. ...................... 331/69; 331/108 D; 331/158
(58) Field of Search .............................. 331/65, 66, 68, 331/69, 70, 108 D, 116 R, 116 FE, 116 M, 158, 175, 176; 310/315, 318, 340–344

(56) References Cited

U.S. PATENT DOCUMENTS

| | | | |
|---|---|---|---|
| 3,969,640 A | * | 7/1976 | Staudte ....................... 310/312 |
| 4,479,096 A | | 10/1984 | Fowks |
| 4,719,384 A | | 1/1988 | Hauden |
| 4,985,687 A | | 1/1991 | Long |
| 5,041,800 A | | 8/1991 | Long |
| 5,180,942 A | | 1/1993 | Marvin |
| 5,405,476 A | | 4/1995 | Knecht |
| 5,438,219 A | | 8/1995 | Kotzan |
| 5,530,408 A | | 6/1996 | Vig |
| 5,640,746 A | | 6/1997 | Knecht |
| 5,703,542 A | | 12/1997 | Blandino |
| 5,917,272 A | | 6/1999 | Clark |
| 6,049,256 A | | 4/2000 | Fry |
| 6,133,674 A | | 10/2000 | Fry |
| 6,147,565 A | | 11/2000 | Satoh |
| 6,208,213 B1 | | 3/2001 | Anastasyev |
| 6,229,404 B1 | | 5/2001 | Hatanaka |
| 6,236,145 B1 | | 5/2001 | Biernacki |

FOREIGN PATENT DOCUMENTS

JP         402203605 A     8/1990

\* cited by examiner

Primary Examiner—David C. Mis
(74) Attorney, Agent, or Firm—Mark P. Bourgeois

(57) ABSTRACT

A miniature ovenized crystal oscillator has a ceramic case that has a cavity, a bottom and a ledge that extends into the cavity. The case has several circuit lines. A substrate is located in the cavity and is supported by the ledge. The substrate has a top and bottom surface and several circuit lines. A crystal is mounted to the bottom surface of the substrate and is connected to the substrate circuit lines. A signal conditioning circuit is mounted to the top surface of the substrate and is connected to the substrate circuit lines. The case circuit lines are connected to the substrate circuit lines by a conductive epoxy. A heater is mounted to the bottom of the ceramic case. A thermal adhesive is located between the heater and the crystal. The thermal adhesive thermally links the crystal and the heater.

14 Claims, 7 Drawing Sheets

MINIATURE OVENIZED CRYSTAL OSCILLATOR

BACKGROUND

1. Field of the Invention

This invention generally relates to ovenized crystal oscillators which provide a stable reference source or frequency in computers or other electronic equipment. Specifically, there is a miniature oscillator assembly for mounting in electronic systems of constrained space requirements.

2. Description of the Related Art

Various devices are well known for providing a reference frequency or source such devices are called oscillators. The oscillator typically has a quartz crystal and may have electronic compensation circuitry to stabilize the output frequency. Ovenized oscillators heat the oscillator to a uniform temperature to obtain a more stable output. The oscillators have been packaged on various support structures and in housings such as metal cans. The size requirements for electronic components are decreasing and at the same time circuit densities are increasing, especially for portable electronics.

Despite the advantages of the prior art oscillators, a current need exists for an ovenized oscillator that has a small package size that minimizes the amount of printed circuit board space used when it is mounted on a printed circuit board.

SUMMARY

It is a feature of the invention to provide a miniature ovenized crystal oscillator.

A further feature of the invention is to provide an ovenized oscillator. The oscillator includes a ceramic case that has a cavity. The case has a bottom and a ledge that extends into the cavity. The case has several circuit lines. A substrate is located in the cavity and is supported by the ledge. The substrate has a first and a second surface and several second circuit lines. The second circuit lines are electrically connected to the first circuit lines by a conductive epoxy. A crystal is mounted to the second surface of the substrate and is electrically connected to the second circuit lines. A signal conditioning circuit is mounted to the first surface of the substrate and is electrically connected to the second circuit lines. A heater is mounted to the bottom of the ceramic case and is electrically connected to the first circuit lines. A thermal adhesive is located between the heater and the crystal. The thermal adhesive thermally links the crystal and the heater. A cover is mounted over the cavity to seal the ceramic case.

Figure 1:
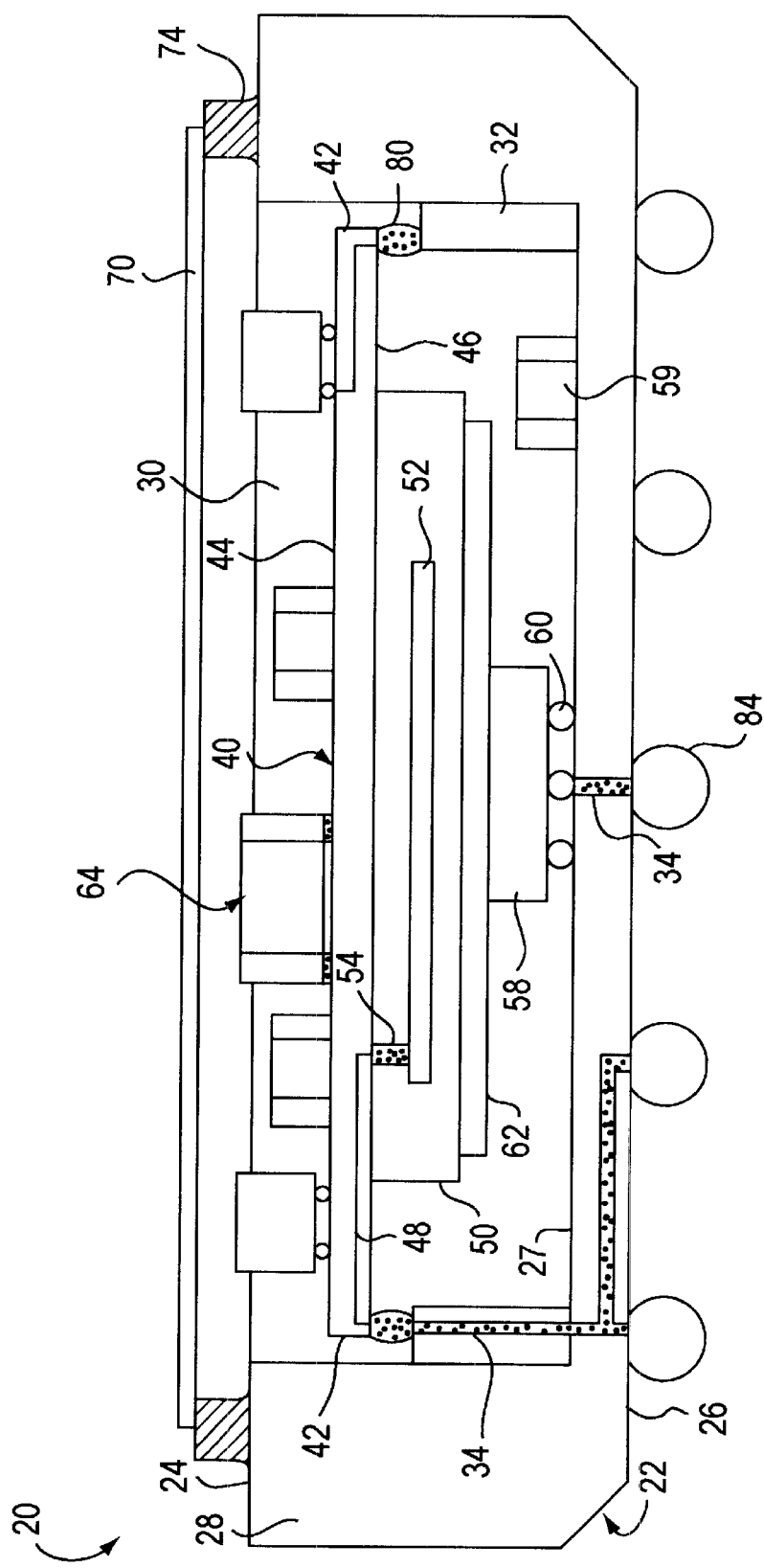
FIG. 1 is a side cross sectional view of a miniature ovenized crystal oscillator.
Figure 2:
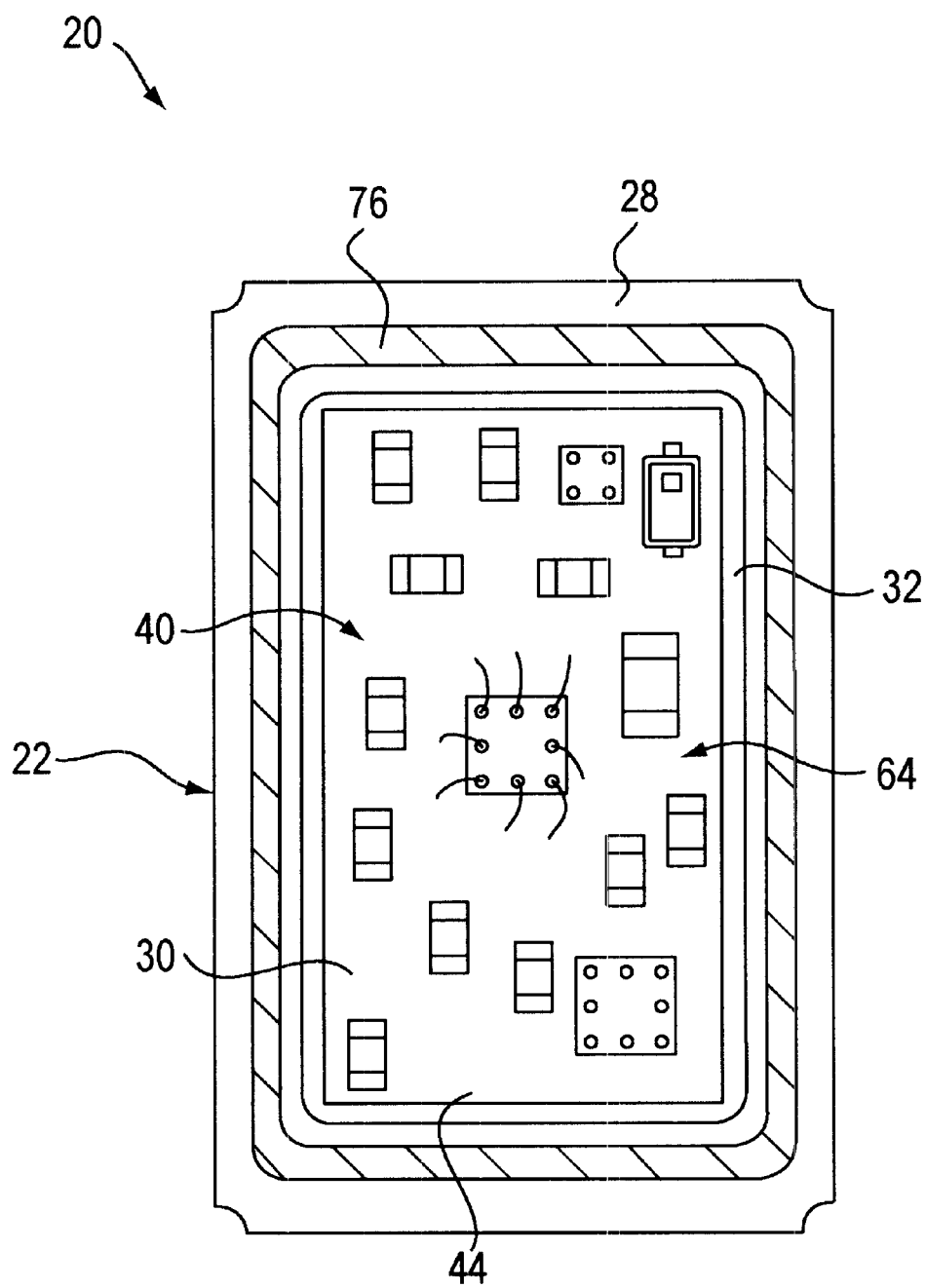
FIG. 2 is a top view of the oscillator of FIG. 1 with the cover removed.
Figure 3:
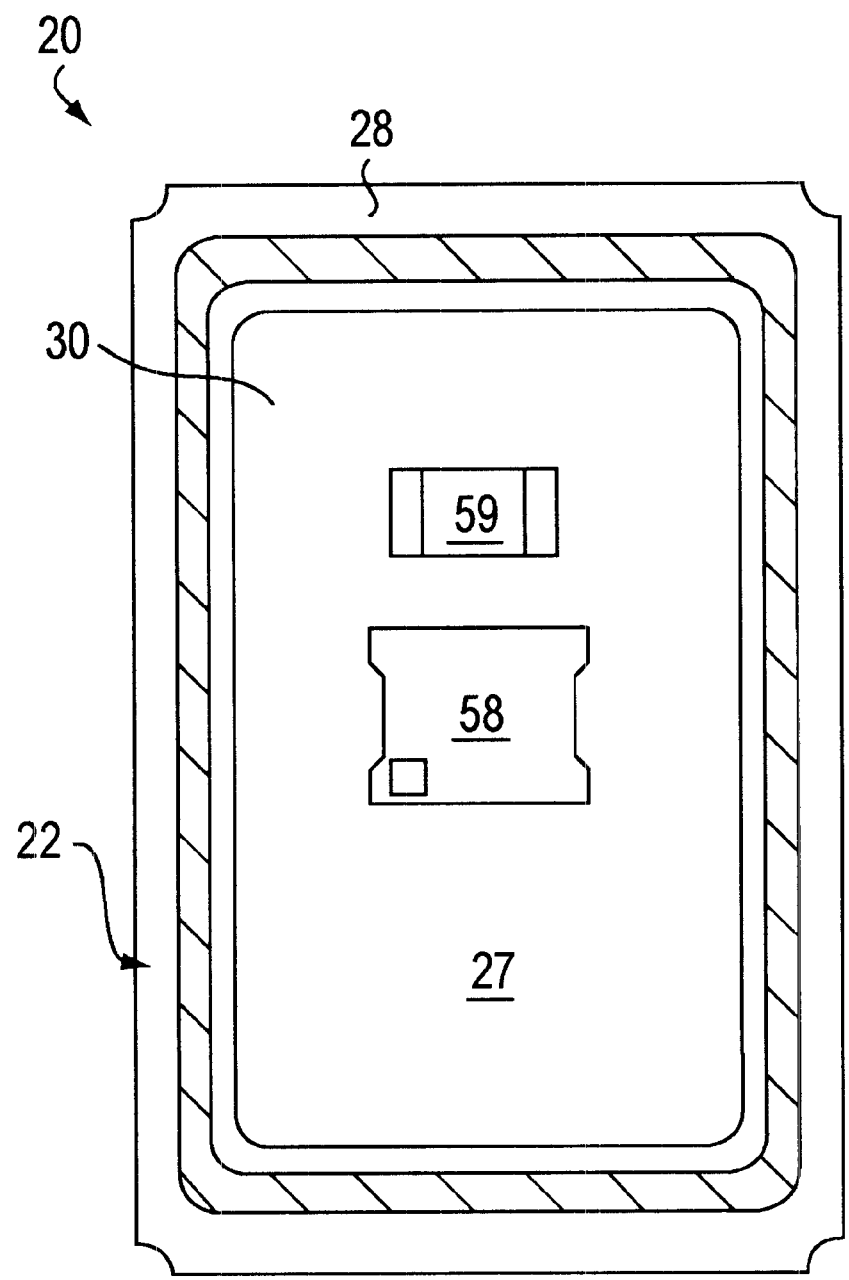
FIG. 3 is top view of the oscillator of FIG. 1 looking into the ceramic package with the oscillator substrate removed.
Figure 4:
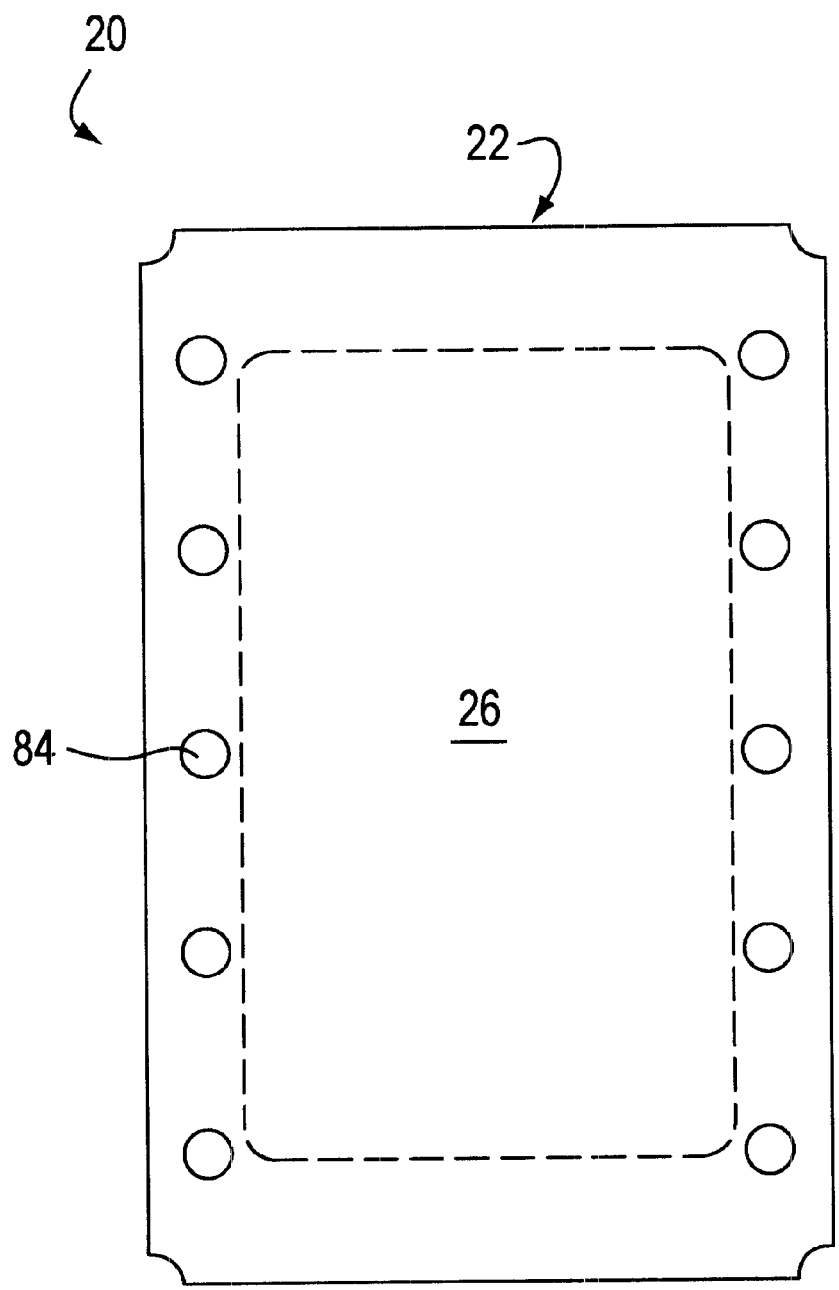
FIG. 4 is a bottom view of the oscillator of FIG. 1.

It is noted that the drawings of the invention are not to scale.

DETAILED DESCRIPTION

Miniature Ovenized Crystal Oscillator

Referring to FIGS. 1–4, a miniature ovenized crystal oscillator 20 is shown. Oscillator 20 includes a ceramic case 22. The case has a top 24, a bottom 26, an inner bottom surface 27 and four side walls 28 that define cavity 30. A ledge 32 extends from all the side walls 28 into cavity 30. The case has several circuit lines 34 that extend through ledge 32 and bottom 26. The case is preferably formed from a low temperature co-fired ceramic (LTCC) which is commercially available from Dupont Corporation, Wilmington, Del. The circuit lines are formed by an electrically conductive composition that is screen printed on to a sheet of the LTCC material and then fired to form a circuit line.

A substrate 40 is located in cavity 30. The outer edge 42 of substrate 40 is supported by the ledge 32. The substrate has a top surface 44 and a bottom surface 46. The substrate has several circuit lines 48. Circuit lines 48 can run on surfaces 44 or 46 or can be internal to substrate 40. Substrate 40 is preferably a thermally conductive ceramic such as aluminum nitride. Aluminum nitride is an excellent conductor of heat and provides a very uniform temperature profile across the entire oscillator.

The substrate circuit lines 48 are electrically connected to the case circuit lines 34 by a conductive epoxy 80. Conductive epoxy 80 is preferably a high thermal resistance epoxy that minimizes heat loss through the substrate. Such conductive epoxies are commercially available from Resin Technology Group, South Easton, Mass. Crystal 50 is mounted to the bottom surface 46 of the substrate and is electrically connected to circuit lines 48. Crystal 50 can be a conventional rectangular strip crystal package formed from ceramic that has a quartz blank 52 mounted inside. A via or conductor 54 connects the quartz blank 52 to circuit lines 48. Crystal 50 can be soldered to substrate 42.

A conventional oscillator signal conditioning circuit 64 is mounted by soldering to the top surface 44 of the substrate and is electrically connected to circuit lines 48. A heater transistor 58 is mounted to inner bottom surface 27 and is electrically connected to a circuit line 34. Heater transistor 58 would be controlled by a heater control circuit 59 that is also mounted to inner bottom surface 27. The heater control circuit turns heater transistor 58 on an off to maintain a stable temperature inside cavity 30. Several solder balls 60 are used to connect transistor 58 to circuit line 34. Transistor 58 can be a power MOSFET.

A thermal adhesive 62 is located between heater 58 and crystal 50. The thermal adhesive thermally joins or links the crystal and the heater. Thermal adhesive 62 is highly heat conductive allowing a large percentage of the heat generated by heater 58 to be transferred to crystal 50. The thermal adhesive 62 is preferably CV-2942 thermally conductive adhesive commercially available from Nusil Technology Corporation, Carpinteria, Cali.

A metal cover 70 is welded over the cavity to hermetically seal the ceramic case. A weld 74 joins the cover 70 to a ring of metallization 76 that is deposited on top surface 24. Cavity 30 is filled with an inert gas such as argon to minimize convective heat transfer within cavity 30.

Several solder balls 84 are mounted to the outer bottom surface 26. Solder balls 84 are formed from a high melting point solder such as 95% lead 5% tin and are joined to bottom surface 26 by a reflowed solder paste composition with a lower melting point such as 63% lead 37% tin. Solder balls 84 electrically connect the circuitry 64 to other external electrical circuits (not shown).

Oscillator 20 can be assembled as follows: Assuming that the case 22 and substrate 40 have been previously patterned and fired, the first step is to solder heater 58, circuitry 59 and solder balls 84 to case 22. A screen printed solder paste would be applied to case 22, the components and solder balls placed and then reflowed in an oven. Next, crystal 50 and circuitry 64 are soldered to substrate 40. Similarly, a screen printed solder paste would be applied to substrate 40, the components and crystal placed and then reflowed in an oven. Conductive epoxy 80 is placed on ledge 32 over circuit lines 34 and substrate 40 circuit line 48 is placed on the conductive epoxy 80 and cured in a low temperature oven. Next, the cover 70 is placed over metallized ring 76 in an argon atmosphere and sealed by using a welding process to form weld 74. The oscillator 20 is then tested.

Alternative Embodiment

Figure 5:
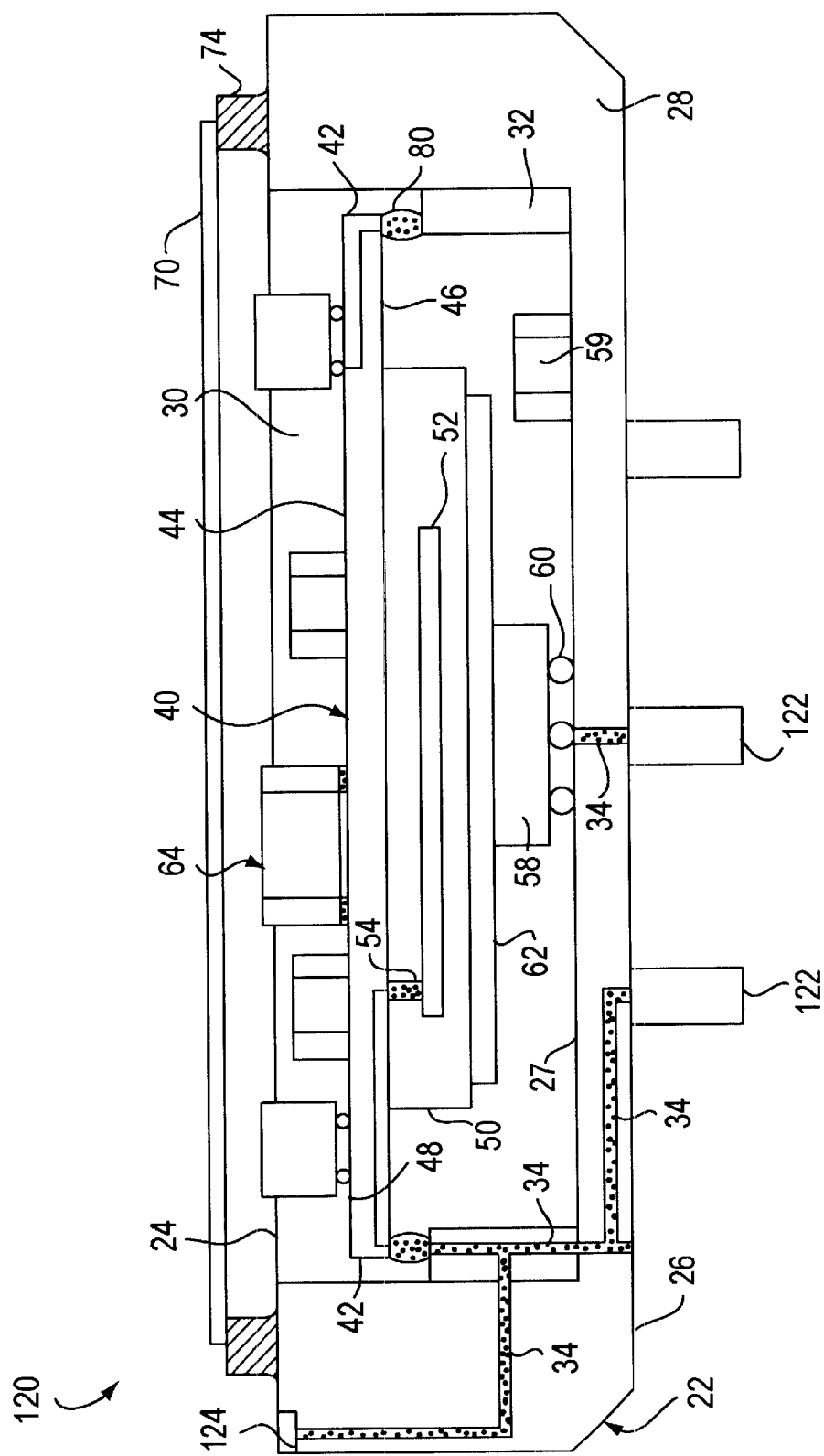
FIG. 5 is a side cross sectional view of an alternative embodiment of a miniature ovenized crystal oscillator.
Figure 6:
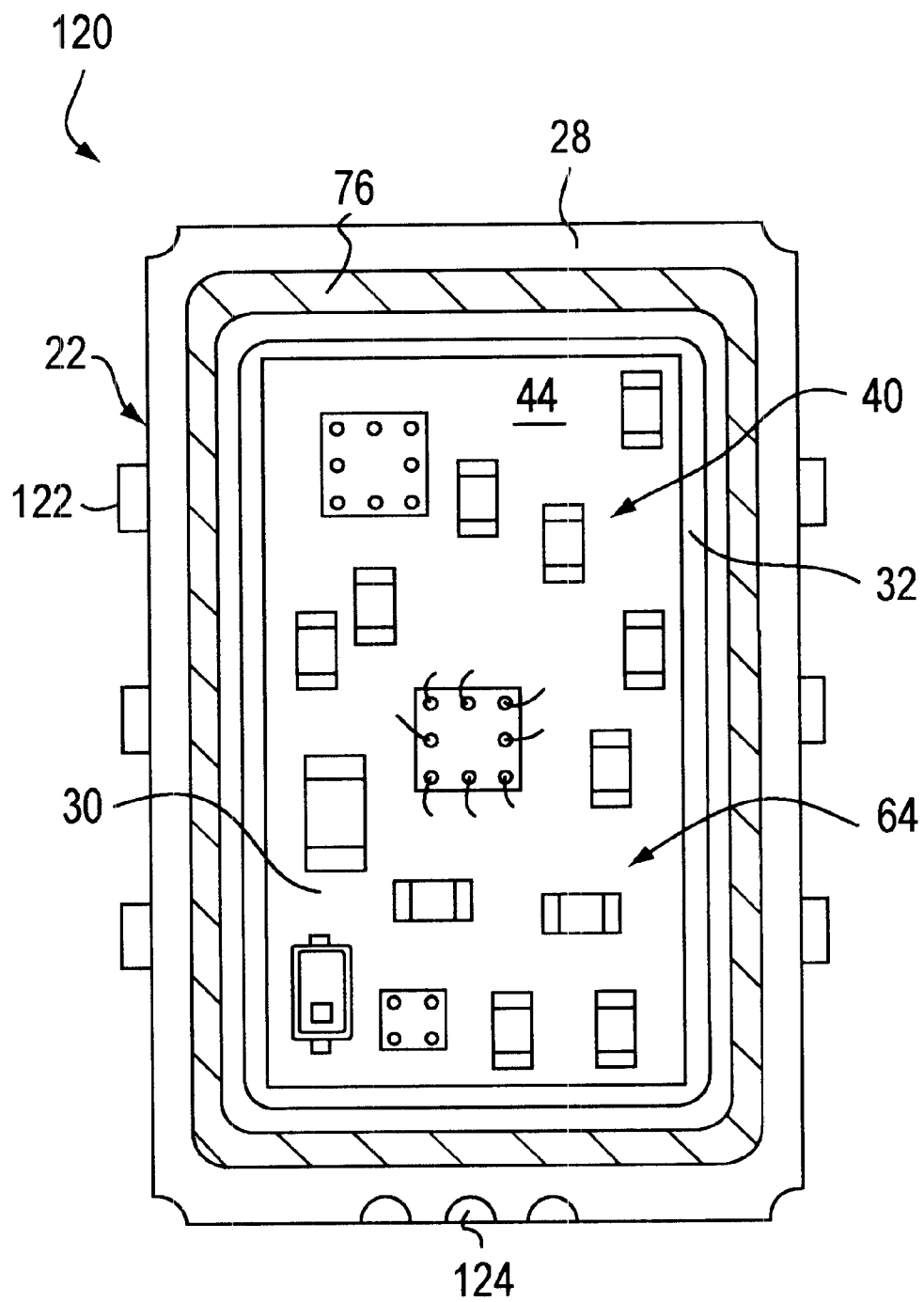
FIG. 6 is a top view of the oscillator of FIG. 5 with the cover removed.
Figure 7:
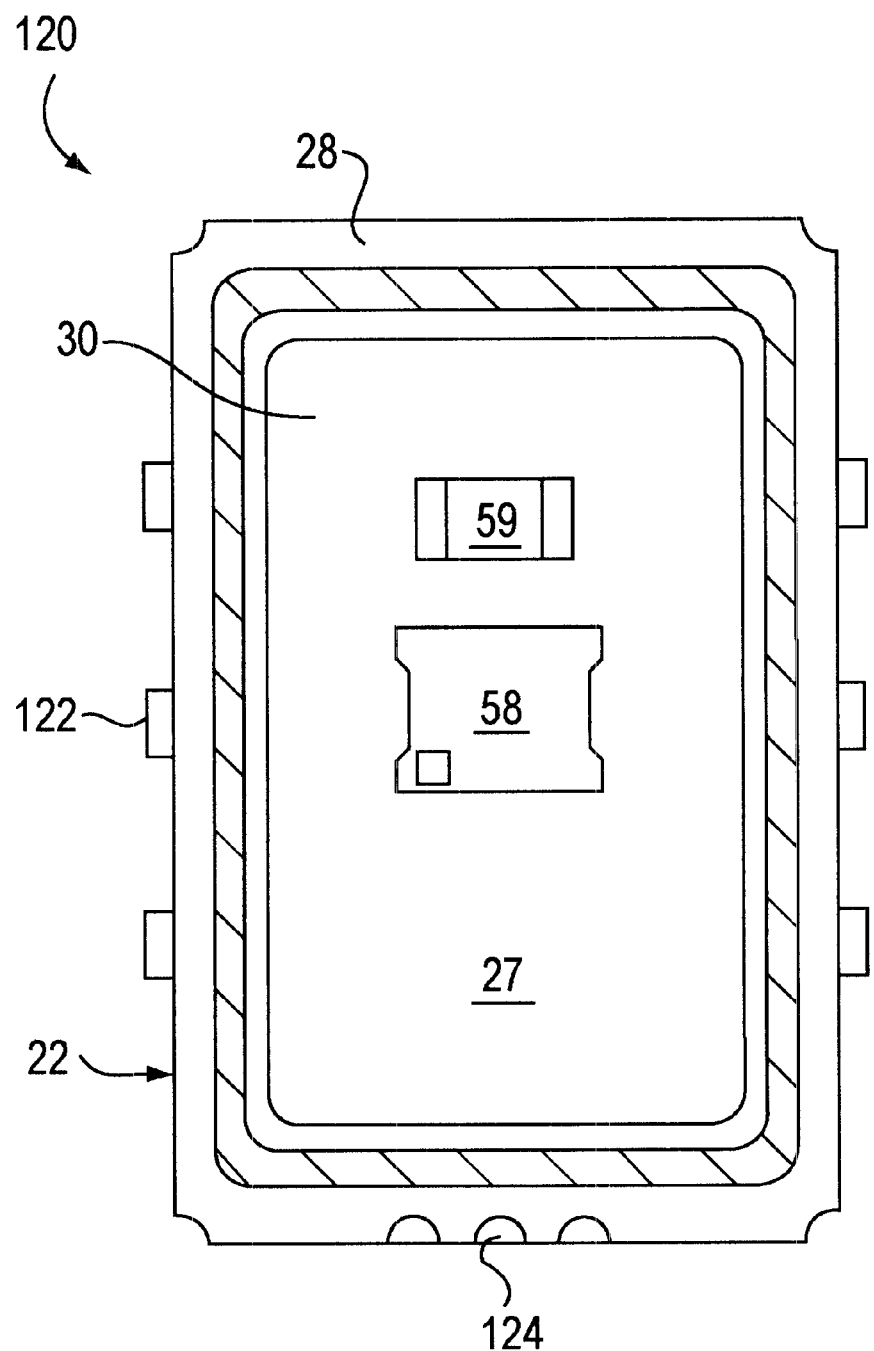
FIG. 7 is top view of the oscillator of FIG. 5 looking into the ceramic package with the oscillator substrate removed.

Referring to FIGS. 5–7, an alternative embodiment of a miniature ovenized crystal oscillator 120 is shown. Oscillator 120 is similar to oscillator 20 except that solder balls 84 have been replaced by j shaped leads 122. Leads 122 would be attached to circuit lines 34 by a reflowed solder paste. Several conductive pads 124 are located on top surface 24 and are connected with circuit lines 34. Conductive pads 124 are contacted by probes during the manufacturing process to adjust parameters of oscillator circuit 64. Oscillator 120 would be assembled in the same manner as for oscillator 20.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. An ovenized oscillator, comprising:
   a) a ceramic case having a cavity therein, the case having a bottom and a ledge extending into the cavity, the case having a plurality of first circuit lines therein;
   b) a substrate located in the cavity and supported by the ledge, the substrate having a first and a second surface and a plurality of second circuit lines therein;
   c) a conductive epoxy located between the ledge and the second surface of the substrate, the conductive epoxy electrically connecting the first and second circuit lines;
   d) a crystal mounted to the second surface of the substrate and electrically connected to the second circuit lines;
   e) a signal conditioning circuit mounted to the first surface of the substrate and electrically connected to the second circuit lines;
   f) a heater mounted to the bottom of the ceramic case and electrically connected to the first circuit lines;
   g) a thermal adhesive located between the heater and the crystal, the thermal adhesive thermally linking the crystal and the heater; and
   h) a cover mounted over the cavity for sealing the ceramic case.

2. The oscillator according to claim 1, wherein the first circuit lines are connected to a plurality of solder balls, the solder balls being mounted to an outer surface of the case.

3. The oscillator according to claim 1, wherein the second circuit lines in the substrate are electrically connected to the first circuit lines in the ceramic case by a conductive epoxy.

4. The oscillator according to claim 1, wherein the cover is welded to the ceramic case.

5. The oscillator according to claim 1, wherein the heater is a power mosfet.

6. The oscillator according to claim 5, wherein the heater is connected to the first circuit lines through a solder ball.

7. The oscillator according to claim 1, wherein the first circuit lines are connected to a plurality of leads, the leads being mounted to an outer surface of the case.

8. An ovenized oscillator, comprising:
   a) a ceramic case having a cavity therein, the case having a inner bottom surface, an outer bottom surface and a plurality of side walls surrounding the cavity;
   b) a ledge extending from each of the side walls into the cavity;
   c) at least one case circuit line extending through the case;
   d) a substrate located in the cavity and carried by the ledge, the substrate having a first and a second surface;
   e) at least one substrate circuit line located on the substrate;
   f) a conductive epoxy electrically connecting the substrate circuit line to the case circuit line;
   g) a crystal mounted to the second surface of the substrate and electrically connected to the substrate circuit line;
   h) a signal conditioning circuit mounted to the first surface of the substrate and electrically connected to the substrate circuit line;
   i) a heater mounted to the inner bottom surface of the ceramic case and electrically connected to the case circuit line;
   j) a thermal adhesive located between the heater and the crystal, the thermal adhesive thermally communicating the crystal and the heater; and
   k) a cover mounted over the cavity for sealing the ceramic case.

9. The oscillator according to claim 8, wherein the case circuit lines are connected to a plurality of solder balls, the solder balls being mounted to the outer bottom surface of the case.

10. The oscillator according to claim 8, wherein the case circuit lines are connected to a plurality of leads, the leads being mounted to the outer bottom surface of the case.

11. The oscillator according to claim 8, wherein the cover is welded to the ceramic case.

12. The oscillator according to claim 8, wherein the heater is a power mosfet.

13. The oscillator according to claim 8, wherein the heater is connected to the case circuit line through a solder ball.

14. The oscillator according to claim 8, wherein the cavity is filled with an inert gas to minimize heat conduction.

* * * * *